United States Patent [19]

Kanda et al.

[11] Patent Number: 4,621,037

[45] Date of Patent: Nov. 4, 1986

[54] METHOD FOR DETECTING ENDPOINT OF DEVELOPMENT

[75] Inventors: Kaoru Kanda; Kunihiko Kanda, both of Yokohama, Japan

[73] Assignee: Sigma Corporation, Kawasaki, Japan

[21] Appl. No.: 752,714

[22] Filed: Jul. 8, 1985

[30] Foreign Application Priority Data

Jul. 9, 1984 [JP] Japan .................................. 59-140551
Jan. 21, 1985 [JP] Japan .................................. 60-007365
Jun. 5, 1985 [JP] Japan .................................. 60-122332

[51] Int. Cl.[4] ............................. G03C 5/24; B60S 1/52
[52] U.S. Cl. ..................................... 430/30; 430/296; 430/325; 430/326; 430/331; 430/966; 430/967; 156/626; 156/627
[58] Field of Search ................. 430/30, 296, 325, 326, 430/331, 966, 967; 156/626, 627

[56] References Cited

FOREIGN PATENT DOCUMENTS 0031639 6/1980 Japan ..................................... 430/30
0758054 8/1980 U.S.S.R. ................................. 430/30

*Primary Examiner*—John E. Kittle
*Assistant Examiner*—Patrick J. Ryan
*Attorney, Agent, or Firm*—Cushman, Darby & Cushman

[57] ABSTRACT

A method for detecting an endpoint of development including the steps of; forming a resist layer on a conductive layer formed on a substrate; exposing the resist layer by using light, X-rays, or electron beams; forming one electrode by connecting a connector consisting of a first conductive material to the conductive layer through the exposed resist layer on the substrate; forming another electrode by dipping an assembly consisting of a second conductive material into a developing solution; and developing the exposed resist layer while monitoring the current flowing between two electrodes.

8 Claims, 8 Drawing Figures

METHOD FOR DETECTING ENDPOINT OF DEVELOPMENT

BACKGROUND OF THE INVENTION

1. Field of the Invention

The present invention relates to a method for detecting an endpoint of development, more particularly, to a method for reliably detecting an endpoint of development of a resist used in the production of semiconductor devices.

2. Description of the Related Art

In the production of semiconductor device, a resist is developed using the difference of solubilities of the exposed and unexposed portions. There has been no appropriate method for detecting the progress of the development. Accordingly, the development process has heretofore been dependent upon the skill of the operators. Skilled operators have been able to satisfactorily control the development process so long as the temperature of the developing solution and the developing time are strictly controlled.

The recent increase in the integration of semiconductor circuit elements, however, has resulted in finer interconnections on the substrate and narrower distances between adjacent lines. This necessitates a more complicated resist pattern and higher precision. Even skilled operators find it difficult to handle this and often overdevelop or underdevelop the resist.

SUMMARY OF THE INVENTION

It is a primary object of the present invention to provide a method for detecting the endpoint of development of a resist without relying on skilled operators.

Another object of the present invention is to provide a method for detecting the endpoint of development of a resist enabling repeated, uniform development.

Still another object of the present invention is to provide a method for detecting an endpoint of development of a resist in which the progress of the development can be easily determined even in a chamber or the like where visual observation is difficult.

A further object of the present invention is to provide a method for detecting an endpoint of development of a resist which can be automatically performed.

To attain the above object, according to the present invention, there is provided a method for detecting an endpoint of development including the steps of: forming a resist layer on a conductive layer formed on a substrate; exposing the resist layer by using light, X-rays, or electron beams; forming one electrode by connecting a connector including a first conductive material to the conductive layer through the exposed resist layer on the substrate; forming another electrode by dipping an assembly consisting of a second conductive material into a developing solution; and developing the exposed resist layer while monitoring the current flowing between the two electrodes.

DESCRIPTION OF THE PREFERRED EMBODIMENTS

The present invention will now be described in detail with respect to the accompanying drawings.

Figure 1:
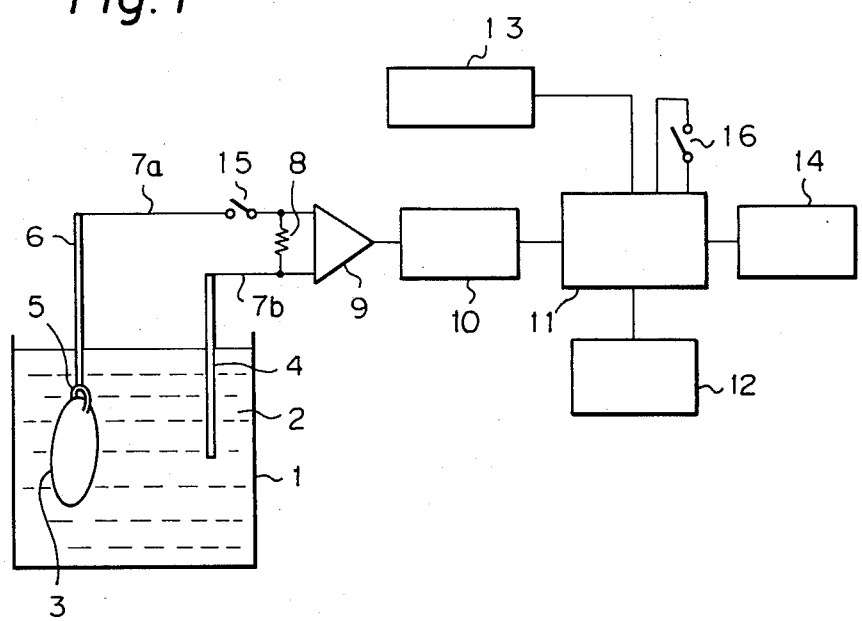
FIG. 1 is a schematic view of explaining an embodiment of the method according to the present invention.
Figure 2A:
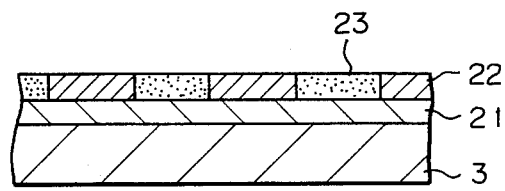
FIG. 2A and 2B are schematic cross-sectional views of a development process of a resist.
Figure 2B:
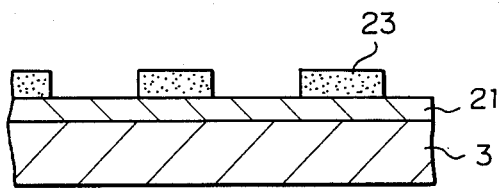

FIG. 1 is a schematic view explaining an embodiment of the method according to the present invention. FIGS. 2A and 2B are schematic cross-sectional views of a development process of a resist.

As shown in FIG. 1, a tank 1 holds developing solution 2, mainly composed of electrolytic sodium hydride (NaOH). A substrate 3 and platinum wire 4 are dipped into the developing solution 2. As shown in FIG. 2A, the substrate 3 is provided with a vapor-deposited aluminum layer 21 having a total thickess of 3000 Å to 1 $\mu$m and an exposed and unexposed positive-photoresist 22 and 23.

In order to monitor the progress of development of the exposed resist 23 by the developing solution 2, two electrodes are used. An aluminum wire 6, connected to the aluminum layer 21 on the substrate 3 through a holding member 5, is used as one electrode. The platimum wire 4 is used as the other electrode. It is preferable that the edge of the holding member 5 be a connector which can easily break through the photoresist to contact the aluminum layer 21. Lead wires 7a and 7b are connected to the upper edges of the aluminum wire 6 and the platinum wire 4, respectively, and are connected to an amplifier 9. The lead wire 7a is further connected to the lead wire 7b through a resistor 8. When the assembly is dipped in the developing solution, the battery action caused by chemical changes produces a current which flows through the resistor 8 with the platinum wire 4 acting as a positive pole and the aluminum wire 6 acting as a negative pole.

The holding member 5 to be brought in contact with the aluminum layer 21 of the substrate 3 is preferably also aluminum, i.e., the holding member 5 is preferably a material the same as that of the electrically conductive layer. In other words, the holding member 5 should have the same electrochemical potential as the electrically conductive layer. If the holding member 5 is composed of a material electrochemically different from the electrically conductive layer, since both the substrate 3 and the holding member 5 brought in contact therewith are dipped in the developing solution 2, a short-circuit is caused in the contact portion. As a result, development is completed first at the periphery of the contact portion. No circuit is formed at the other portion of the electrically conductive layer, with the result that correct inspection of the progress of development is impossible. If the holding member 5 is covered with, for example, fluororubber, to prevent contact with the developing solution, however, the holding member 5 may be a different material.

The progress of the inspection of the development of the resist will be explained below.

When the substrate 3 is placed in the developing tank 1 and the start switch is depressed, a timer is actuated to measure the development time. A signal of the timer is sent to a processing unit 11 at predetermined intervals, for example, 1 second, to interrupt the same. The processing unit 11 closes the contact 15 of the reed relay for about 20 milliseconds to measure the development current—the current produced by development is converted to voltage by the resistor 8, amplified by the amplifier 9, input to the processing unit 11 through an analog-to-digital (A/D) converter 10, and compared with the value of a developing current memory circuit 12.

Figure 3:
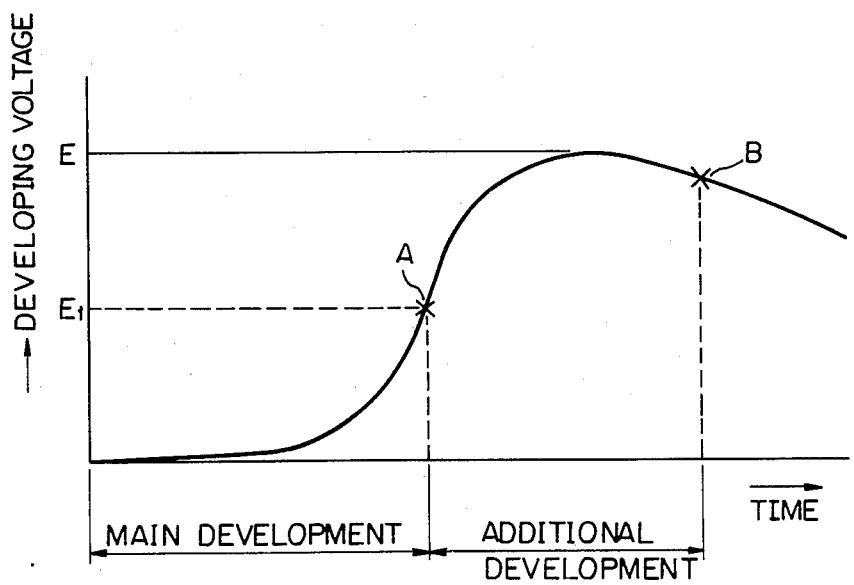
FIG. 3 is a graph of the relationship between the developing voltage and time.

When the difference between the compared currents is small, the newly measured current value is stored in the developing current memory circuit 12. When the newly measured current value is much higher than the previously measured value, namely, the value stored in the developing current memory circuit 12, that is, at the time of voltage E, (Point A in FIG. 3), it is judged that the main development is ended. The development process is continued. When the measured voltage reaches a point B in FIG. 3, it can be judged that the additional development process is ended. The additional development factor may be a predetermined period from the main development end time or percent time of the main development process set in an additional development factor memory circuit 13. Further, the point of time when the maximum voltage E is detected can be judged the endpoint of the main development process and the additional development process effected thereafter. Reference numeral 14 designates a buzzer or timer mechanism or the like for indicating the endpoint of development.

In the above embodiment, a platinum wire is used as the electrode electrically opposed to the electrode for the substrate 3. However, any conductive material can be used in place of platinum. Further, in addition to aluminum, metal layers of molybdenum, tungsten silicon, or the like can be used.

Figure 4:
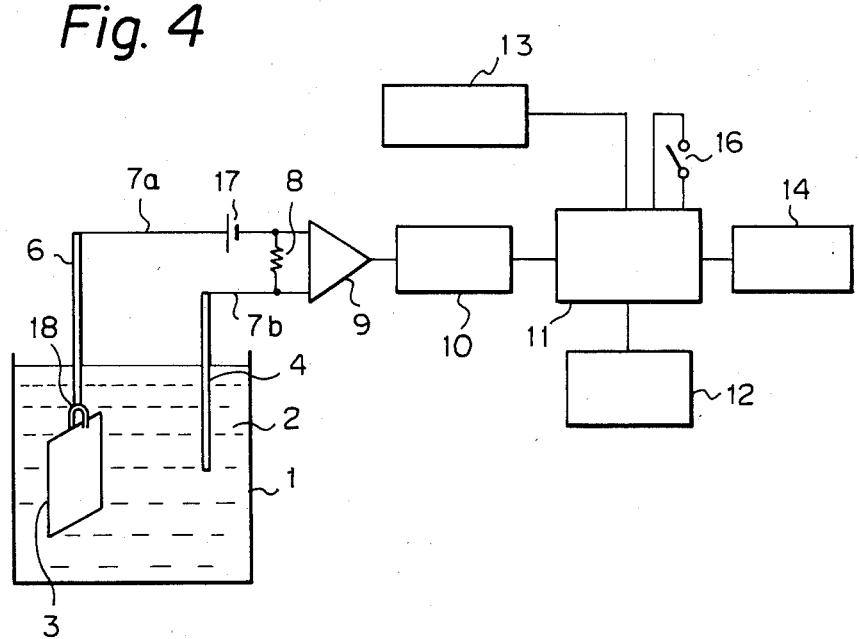
FIG. 4 is a schematic view explaining another embodiment of the method according to the present invention.

FIG. 4 is a schematic view explaining another embodiment of the method according to the present invention.

As shown in FIG. 4, an electric cell 17 is provided in place of the contact 15 of the reed relay in FIG. 1.

As shown in FIG. 4, a tank 1, holds a developing solution 2 mainly composed of isopropyl alcohol. A substrate 3 and platinum wire 4 are dipped into the developing solution 2. The substrate 3 consisting of, for example, glass, is provided with a vapor-deposited chromium layer, having a thickness of 500 Å to 1500 Å in place of the deposited aluminum layer 21 in FIG. 2A, and is provided with a positive-type electron beam resist, for example, polymethyl methacrylate (PMMA) scanned by on electron beam, (scanned positive-type resist 23 and unscanned positive type resist 22 in FIG. 2A).

In order to monitor the progress of development of the electron-beam scanned portion 23 of the resist, a conductor wire covered by Teflon ® is brought into contact with the chromium layer on the substrate 3 through a holding member 18 by breaking through the resist film and used as one electrode.

The platinum wire 4 is used as the other electrode. Vinyl lead wires 7a and 7b are connected to the upper edges of the conductor wire 6 and the platinum wire 4 respectively, which are connected to an amplifier 9. Further, the vinyl lead wire 7a is connected to the lead wire 7b through a resistor 8.

As shown in FIG. 4, when voltage is applied on the the lead wire through an electric cell 17, electric current flows, with the platinum wire 4 forming a positive pole and the conductor wire 6 a negative pole. Since, in this embodiment, the isopropyl alcohol is not electrolytic solution the electro motive force is small. Thus, the electric cell 17 is needed.

Figure 5A:
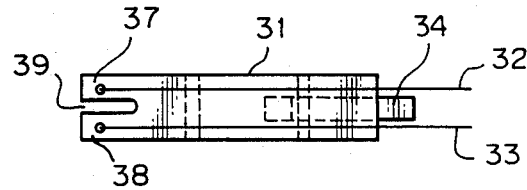
FIG. 5A and 5B are a top view and side view of a connector used in the present invention.
Figure 5B:
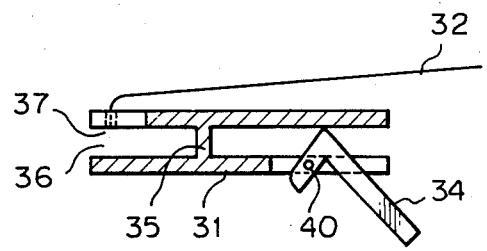

FIGS. 5A and 5B are a top view and side view of a connector used in the present invention.

Reference numerals 31 designates a connector body and 32 and 33 first and second electrodes consisting of, for example, aluminum. Fluorine plastic or the like is used for the connector body 31 and a lever 34.

After putting a wafer having a deposited aluminum layer within a gap 36, the lever 34 is pivoted about its rotary axis to press the deposited aluminum layer via the resist and thus connect the contacts 37 and 38 of the aluminum wires 32 and 33 to the deposited aluminum layer. This connector is provided with a groove 39 so that the contacts 37 and 38 are uniformly brought into contact with the surface of the aluminum layer.

Figure 6:
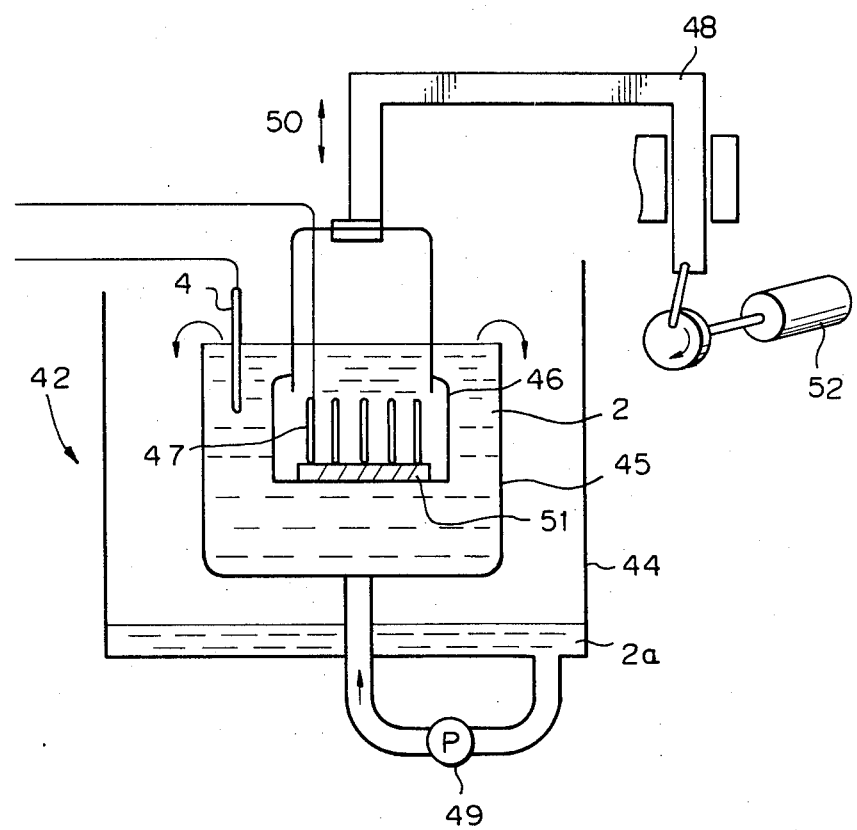
FIG. 6 is a schematic view of an embodiment of a developing tank for the present invention.

FIG. 6 is a schematic view of an embodiment of a developing tank for performing the present invention.

As shown in FIG. 6 developing tank 42 comprises an outer tank 44 and inner tank 45. The inner tank 45 holds a developing solution 2. A plurality of wafers 47 fed by a carrier 46 and supported by a supporting plate 51 are dipped in the developing solution 2.

On each wafer 47, a conductive layer and a resist layer are formed. The carrier 46 is connected to a motor through a feeding mechanism 48. The wafers 47, which move together with the carrier 46 through the supporting plate 51, are vibrated by vibrating the carrier 46 by means of the motor 52. Thus, uniform development is carried out. An aluminum wire is connected to an aluminum film on the wafers. A platinum wire 4, acting as an electrode, is dipped in the developing solution 2. The aluminum wire and the platinum wire are connected to a detecting apparatus (not shown). The developing solution 2a overflowing from the upper portion of the inner tank 45 to the outer tank 44 is pumped up by a pump 49 to feed it into the inner tank 45 form the lower portion thereof. Thus circulates the developing solution 2a and improves the developing efficiency and developing uniformity.

We claim:

1. A method for detecting an endpoint of development comprising the steps of:
    forming a resist layer on a conductive layer formed on a substrate;
    exposing the resist layer by using light, X-rays, or an electron beam;
    forming one electrode by connecting a connector, including a first conductive material, to said conductive layer through the exposed resist layer on the substrate;
    dipping said one electrode and spaced therefrom another electrode including a second conductive material into a developing solution to start development of the exposed resist layer which results in chemical changes in the solution causing a battery action and producing a current flowing between said electrodes;
    developing a voltage solely from said current; and
    monitoring said voltage while the development of said exposed resist layer continues to determine the endpoint of the development of resist.

2. A method according to claim 1, wherein said first conductive material is the same material as said conductive layer.

3. A method according to claim 1, wherein the connector is covered to prevent contact with the developing solution when dipped into the developing solution.

4. A method according to claim 1, wherein an endpoint of main development of the resist layer is detected by monitoring the change of current between said two electrodes and additional development is performed in accordance with an additional development factor, the endpoint of the additional development being judged as the endpoint of the development.

5. A method according to claim 1, wherein said endpoint of development is the time when current falls below a defined value.

6. A method according to claim 1, wherein said endpoint of development is the time when a rate of rise of said current decreases.

7. A method according to claim 4, wherein said change of current monitored is the maximum point of a slope.

8. A method according to claim 4, wherein said monitoring of current is performed by using an apparatus provided with a development monitoring means, an additional development factor means, and processing control means.

* * * * *